United States Patent
Lee et al.

(10) Patent No.: US 8,305,823 B2
(45) Date of Patent: Nov. 6, 2012

(54) SENSE AMPLIFIER AND SEMICONDUCTOR INTEGRATED CIRCUIT USING THE SAME

(75) Inventors: Myoung Jin Lee, Ichon-si (KR); Hyung Sik Won, Ichon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 110 days.

(21) Appl. No.: 12/648,414

(22) Filed: Dec. 29, 2009

(65) Prior Publication Data

US 2011/0051543 A1 Mar. 3, 2011

(30) Foreign Application Priority Data

Aug. 31, 2009 (KR) .................. 10-2009-0081021

(51) Int. Cl.
*G11C 7/00* (2006.01)

(52) U.S. Cl. .................. 365/205; 365/207; 365/226

(58) Field of Classification Search ............. 365/205, 365/207, 226
See application file for complete search history.

(56) References Cited

U.S. PATENT DOCUMENTS

| | | | | |
|---|---|---|---|---|
| 4,169,233 A | * | 9/1979 | Haraszti | 327/57 |
| 5,544,110 A | * | 8/1996 | Yuh | 365/205 |
| 6,288,950 B1 | | 9/2001 | Koike | |
| 6,304,505 B1 | | 10/2001 | Forbes et al. | |
| 6,735,134 B2 | | 5/2004 | Park | |
| 2006/0023534 A1 | | 2/2006 | Do | |
| 2006/0092735 A1 | | 5/2006 | Do et al. | |

FOREIGN PATENT DOCUMENTS

| | | |
|---|---|---|
| JP | 2003-123473 | 4/2003 |
| JP | 2006-031922 | 2/2006 |
| KR | 10-1999-0062409 A | 7/1999 |
| KR | 10-2009-0113560 A | 11/2009 |

* cited by examiner

*Primary Examiner* — Huan Hoang
(74) *Attorney, Agent, or Firm* — William Park & Associates Ltd.

(57) ABSTRACT

A semiconductor integrated circuit having a sense amplifier includes first and second inverters each having an output terminal coupled to an input terminal of the other inverter. The first inverter is configured to be activated in response to a first and a third activation signals, and the second inverter is configured to be activated in response to a second and a fourth activation signals. The first and third activation signals and the second and fourth activation signals are provided through separate signal sources from each other.

20 Claims, 3 Drawing Sheets

120

130

140

150

160

SENSE AMPLIFIER AND SEMICONDUCTOR INTEGRATED CIRCUIT USING THE SAME

CROSS-REFERENCE TO RELATED APPLICATION

The present application claims priority under 35 U.S.C. §119(a) to Korean Application No. 10-2009-0081021, filed on Aug. 31, 2009, in the Korean Intellectual Property Office, which is incorporated herein by reference in its entirety as if set forth in full.

BACKGROUND

1. Technical Field

The present invention relates to a semiconductor circuit, and more particularly, to a sense amplifier and a semiconductor integrated circuit using the same.

2. Related Art

A semiconductor memory device, which is a representative example of semiconductor integrated circuits, includes a plurality of memory cells as a basic unit for storing data.

In a process of writing data to a memory cell or reading data stored in the memory cell, a sense amplifier is used as a unit for sensing and amplifying a logic level of the data.

The sense amplifier is coupled to a memory cell through a bit line pair comprising a bit line BL and a bit bar line BLB, and senses a voltage difference between the bit line pair to determine a logic level of the data.

The sense amplifier plays a very important role in writing data to a memory cell or reading data stored in a memory cell.

Therefore, the improvement of data sensing performance of the sense amplifier should be accomplished to enhance the performance of a semiconductor memory device.

SUMMARY

A sense amplifier capable of improving data sensing performance is described herein.

A semiconductor integrated circuit capable of improving integration is described herein.

In one aspect of the present invention, a semiconductor integrated circuit including a sense amplifier comprises: first and second inverters each having an output terminal coupled to an input terminal of the other inverter, the first inverter being configured to be activated in response to a first and a third activation signals, and the second inverter being configured to be activated in response to a second and a fourth activation signals. The first and third activation signals and the second and fourth activation signals are provided through separate signal sources from each other.

In another aspect of the present invention, a semiconductor integrated circuit including a sense amplifier comprises: a first circuit component for sensing one of a pair of data lines; and a second circuit component for sensing the other of the pair of data lines. The first and second circuit components are configured to be activated in response to a first set of activation signals and a second set of activation signals, and the first and second sets of activation signals are provided through separate signal sources from each other.

In another aspect of the present invention, a semiconductor integrated circuit comprises: a memory cell; and a sense amplifier coupled to the memory cell through a pair of data lines which comprises a circuit component for sensing one of the pair of data lines and another circuit component for sensing the other of the pair of data lines such that the circuit components are activated in to response to separate activation signals. The respective activation signals are provided through separate signal sources from each other.

In another aspect of the present invention, a semiconductor integrated circuit comprises: a memory cell lock; and a plurality of sense amplifiers coupled to the memory cell block through each of the pairs of bit lines which comprise a circuit component for sensing one of the pair of data lines and another circuit component for sensing the other of the pair of data lines such that the circuit components are activated in response to separate activation signals. The plurality of sense amplifiers are provided with respective activation signals through separate signal sources from each other.

BRIEF DESCRIPTION OF THE DRAWINGS

Features, aspects, and embodiments are described in conjunction with the attached drawings, in which.

DETAILED DESCRIPTION

Hereinafter, a sense amplifier and a semiconductor integrated circuit using the same, according to the present invention, will be described below with reference to the accompanying drawings to through preferred embodiments.

Figure 1:
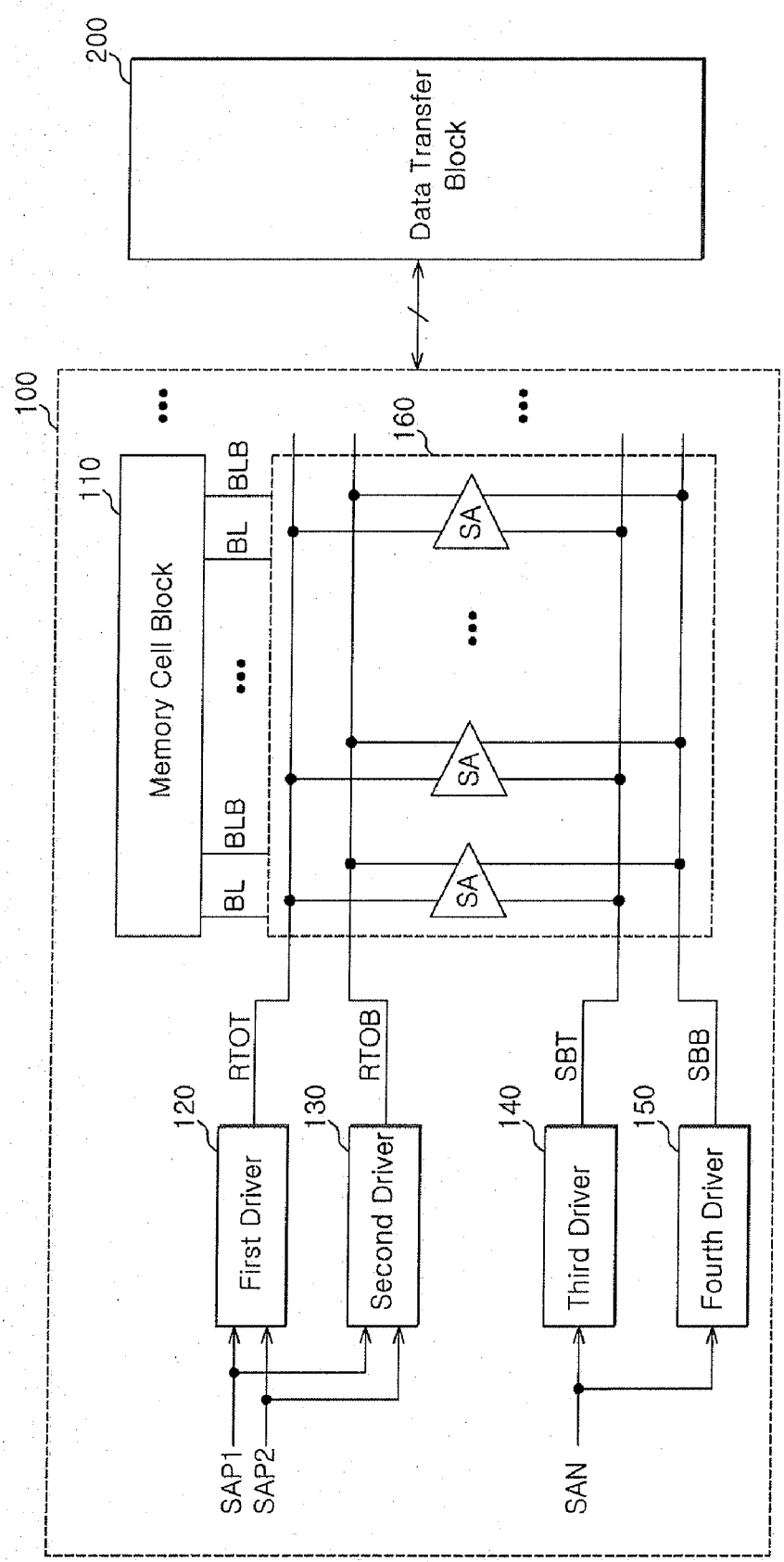
FIG. 1 is a circuit diagram of a semiconductor integrated circuit according to one embodiment.

Referring to FIG. 1, a semiconductor integrated circuit 10 according to one embodiment includes a core block 100 and a data transfer block 200.

The core block 100 includes a memory cell block 100, first to fourth drivers 120-150, and a sense amplifier array 160.

The memory cell block 110 includes a plurality of memory cells. The memory cell block 110 is a unit for partitioning and controlling all memory cells and may be a unit cell array.

The first to fourth drivers 120-150 are provided as separate signal sources from each other which generate activation signals RTOT, SBT, RTOB, and SBB for controlling the sense amplifier array 160, respectively.

The first to fourth drivers 120-150 are configured to generate separate signals, including a pair of first activation signals RTOT and SBT and a pair of second activation signals RTOB and SBB, in response to first to third sense amplifier driving signals SAP1, SAP2, and SAN.

The first driver 120 is configured to generate the first activation signal RTOT in response to the first and second sense amplifier driving signals SAP1 and SAP2.

The second driver 130 is configured to generate the second activation signal RTOB in response to the first and second sense amplifier driving signals SAP1 and SAP2.

The third driver 140 is configured to generate the first activation signal SBT in response to the third sense amplifier driving signal SAN.

The fourth driver 150 is configured to generate the second activation signal SBB in response to the third sense amplifier driving signal SAN.

The sense amplifier array 160 includes a plurality of sense amplifiers. Each of the sense amplifiers is coupled to the memory cell block 110 through a data line pair, that is, a bit line BL and a bit bar line BLB.

Each of the sense amplifiers is configured to be activated in response to the first activation signals RTOT and SBT and the second activation signals RTOB and SBB independently through separate signal lines.

The data transfer block 200 may include various circuit components for providing data outputted from the core block 100 to the outside of the semiconductor integrated circuit and providing external data to the core block 100.

Figure 2:
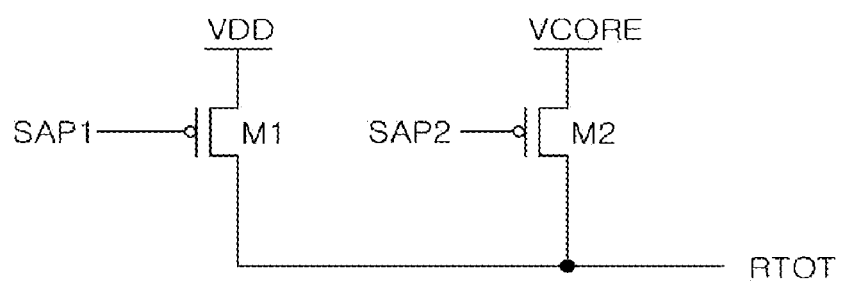
FIGS. 2 to 5 are circuit diagrams of first to fourth drivers.

FIG. 2 is a circuit diagram of the first driver 120 illustrated in FIG. 1. Referring to FIG. 2, the first driver 120 includes a plurality of transistors M1 and M2. Drains of the plurality of transistors M1 and M2 are coupled to each other, and output the first activation signal RTOT as, for example, a first power supply voltage such as an external voltage VDD or core voltage VCORE, in response to the first sense amplifier driving signal SAP1 or second sense amplifier driving signal SAP2.

Figure 3:
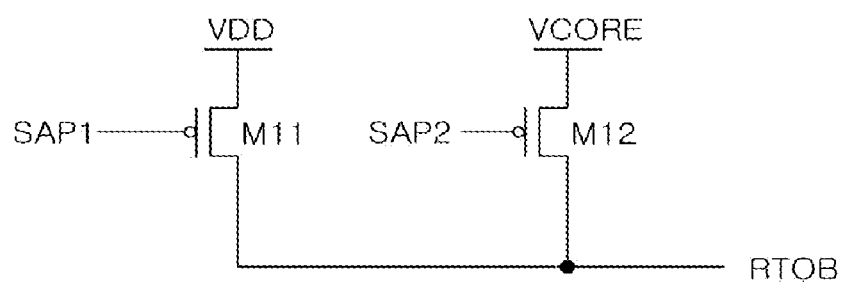

FIG. 3 is a circuit diagram of the second driver 130 illustrated in FIG. 1. Referring to FIG. 3, the second driver 130 includes a plurality of transistors M11 and M12. Drains of the plurality of transistors M11 and M12 are coupled to each other, and output the second activation signal RTOB as, for example, a second power supply voltage such as an external voltage VDD or core voltage VCORE, in response to the first sense amplifier driving signal SAP1 or second sense amplifier driving signal SAP2.

Figure 4:
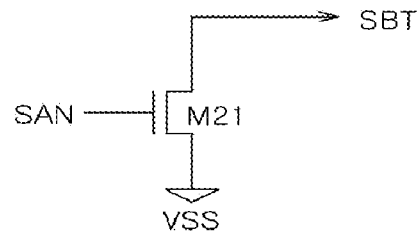

FIG. 4 is a circuit diagram of the third driver 140 illustrated in FIG. 1. Referring to FIG. 4, the third driver 140 includes a transistor M21 which outputs the first activation signal SBT as, for example, a first ground voltage such as a ground voltage VSS, in response to the third sense amplifier driving signal SAN.

Figure 5:
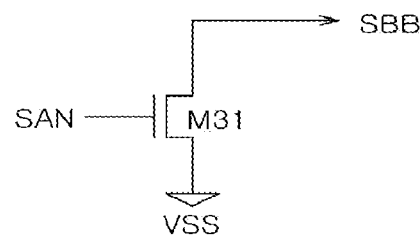

FIG. 5 is a circuit diagram of the fourth driver 150 illustrated in FIG. 1. Referring to FIG. 5, the fourth driver 150 includes a transistor M31 which outputs the second activation signal SBB as, for example, a second ground voltage such as a ground voltage VSS, in response to the third sense amplifier driving signal SBN.

A plurality of sense amplifiers are allocated to the first to fourth drivers 120-150, respectively, to activate the sense amplifiers. The number of sense amplifiers to be allocated may differ depending on drivability of the first to fourth drivers 120-150.

Figure 6:
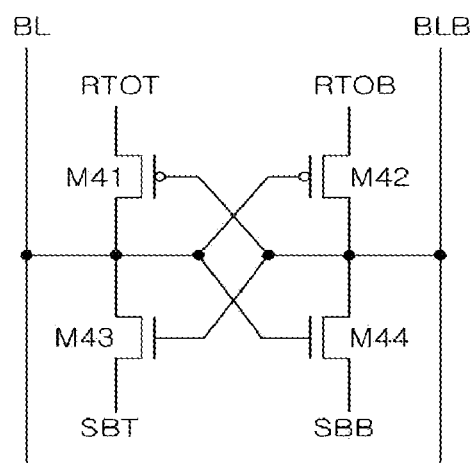
FIG. 6 is a circuit diagram of a sense amplifier of FIG. 1.

FIG. 6 is a circuit diagram of the sense amplifier illustrated in FIG. 1. Referring to FIG. 6, the sense amplifier is a cross coupled latch connected between a bit line pair BL and BLB and includes a to plurality of transistors M41 to M44. The cross coupled latch includes two inverters as circuit components for sensing the bit line pair BL and BLB. Each of the two inverters has an output terminal coupled to an input terminal of the other inverter. One of the two inverters comprises a transistor pair M41 and M43, and the other comprises a transistor pair M42 and M44.

As shown in the drawing, each of the signal lines for supplying the first activation signals RTOT and SBT to the transistor pair M41 and M43 is separated from each of the signal lines for supplying the second activation signals RTOB and SBB to the transistor pair M42 and M44, respectively.

The operation of the semiconductor integrated circuit configured in such a manner according to the embodiment will be described below.

Data written in the memory cell block 100 may cause noise depending on the pattern thereof.

For example, when data having a second logic value, for example, "0" (hereinafter, referred to as "island pattern"), is included among a plurality of data having a first logic value, for example, "1" (hereinafter, referred to as "solid pattern"), the island pattern may include noise generated from interference with the solid patterns. The island pattern is highly likely to be inputted to the sense amplifier while mixed with noise.

That is, the island pattern has a larger offset than the solid patterns, which decreases the sensing margin of the SA.

Furthermore, the noise problem caused by the island pattern may serve as an obstacle to increasing the size of the memory cell block, for example, a unit cell array.

In the embodiment when sensing the solid patterns and the island pattern, a difference in current consumption between the symmetrical internal circuit components composing the cross coupled latch of the sense amplifier may be used to increase the sensing margin of the SA.

To emphasize the difference in current consumption between the symmetrical internal circuit components, the respective drivers provide separate activation signals to the symmetrical circuit components of the sense amplifier through the separate signal lines.

That is, the first activation signals RTOT and SBT and the second activation signals RTOB and SBB are generated by the separate individual drivers, that is, the first to fourth drivers 120-150, respectively. Furthermore the transistor pairs of the SA, that is, the transistor pair M41 and M43 and the transistor pair M42 and M44 for sensing the bit line pair BL and BLB, respectively, receive separate activation signals, that is, the first activation signals RTOT and SBT and the second activation signals RTOB and SBB through the separate signal lines.

Referring back to FIG. 6, each of the sense amplifiers coupled to memory cells in which mostly solid patterns having a logic value of, for example, "1" are stored senses and amplifies a charge sharing voltage difference of the corresponding bit line pair BL and to BLB through current consumption of the first activation signal RTOT and the second activation signal SBB by the operation of the transistors M41 and M44.

At this time, since the number of the solid patterns having a logic value of "1" is much larger than that of island patterns having a logic value of "0", the current consumption of the first activation signal RTOT and the second activation signal SBB increases, and a drop in the voltage level of the first activation signal RTOT increases more rapidly than that in the voltage level of the second activation signal RTOB.

Therefore, a voltage difference between the second activation signal RTOB and the first activation signal SBT having low current consumption becomes larger than a voltage difference between the first activation signal RTOT and the second activation signal SBB.

The sense amplifier coupled to a memory cell in which the island pattern having a logic value of "0" is stored senses and amplifies a charge sharing voltage difference of the corresponding bit line pair BL and BLB through current consumption of the second activation signal RTOB and the first activation signal SBT by the operation of the transistors M42 and M43.

As described above, the voltage difference between the second activation signal RTOB and the first activation signal SBT is set to be larger than the voltage difference between the first activation signal RTOT and the second activation signal SBB such that sensing performance for the island pattern is improved. Therefore, it is possible to stably sense the island pattern, even when noise is mixed in the island pattern.

The data sensed and amplified by the sense amplifier is output to the outside of the semiconductor integrated circuit through the data transfer block 200.

The size of the memory cell block, for example, the unit cell array is limited by the noise problem caused by the island pattern. In this embodiment, however, since the noise of the island pattern can be compensated for by the improvement of the sensing performance of the SA, it is possible to increase the size of the memory cell block.

While certain embodiments have been described above, it will be understood to those skilled in the art that the embodiments described are by way of example only. Accordingly, the sense amplifier and the semiconductor integrated circuit described herein should not be limited based on the described embodiments. Rather, the sense amplifier and the semiconductor integrated circuit described herein should only be limited in light of the claims that follow when taken in conjunction with the above description and accompanying drawings.

What is claimed is:

1. A semiconductor integrated circuit including a sense amplifier, comprising:
   first and second inverters each having an output terminal coupled to an input terminal of the other inverter, the first inverter being configured to be activated in response to a first and a third activation signals, and the second inverter being configured to be activated in response to a second and a fourth activation signals;
   wherein power terminals of the first inverter receiving the first and third activation signals are separate from power terminals of the second inverter receiving the second and fourth activation signals,
   wherein, the first to fourth activation signals are independent from each other and are provided through separate and independent signal sources from each other.

2. The semiconductor integrated circuit according to claim 1, further comprising:
   a first driver configured to generate the first activation signal in response to a first sense amplifier driving signal; and
   a second driver configured to generate the second activation signal in response to the first sense amplifier driving signal.

3. The semiconductor integrated circuit according to claim 1, wherein the first inverter is configured to receive a first power supply voltage and a first ground voltage as the first and third activation signals.

4. The semiconductor integrated circuit according to claim 3, wherein the second inverter is configured to receive a second power supply voltage and a second ground voltage as the second and fourth activation signals.

5. The semiconductor integrated circuit according to claim 2, wherein the first driver is configured to output a first power supply voltage as the first activation signal and the second driver is configured to output a second power supply voltage as the second activation signal in response to the first sense amplifier driving signal.

6. A semiconductor integrated circuit including a sense amplifier, comprising:
   a first circuit component for sensing one of a pair of data lines; and
   a second circuit component for sensing the other of the pair of data lines;
   wherein the first and second circuit components are configured to be activated in response to a first set of activation signals and a second set of activation signals, and
   wherein power terminals of the first circuit component receiving the first set of activation signals are separate from the power terminals of the second circuit component receiving the second set of activation signals,
   wherein, the first set of activation signals and the second set of activation signals are independent from each other and are provided through separate and independent signal sources from each other.

7. The semiconductor integrated circuit according to claim 6, further comprising a plurality of drivers configured to independently generate the first and second sets of activation signals in response to sense amplifier driving signals.

8. The semiconductor integrated circuit according to claim 6, wherein the first circuit component is configured to receive a first power supply voltage and a first ground voltage as the first set of activation signals.

9. The semiconductor integrated circuit according to claim 8, wherein the second circuit component is configured to receive a second power supply voltage and a second ground voltage as the second set of activation signals.

10. The semiconductor integrated circuit according to claim 9, wherein the first power supply voltage and the second power supply voltage have substantially same level.

11. The semiconductor integrated circuit according to claim 7, wherein the plurality of drivers are configured to output one of a first-level power supply voltage and a second-level power supply voltage as one of the first and second sets of activation signals in response to first and second sense amplifier driving signals, and output a ground voltage as the other of the first and second sets of activation signals in response to a third sense amplifier driving signal.

12. A semiconductor integrated circuit comprising:
    a memory cell; and
    a sense amplifier coupled to the memory cell through a pair of data lines which comprises a circuit component for sensing one of the pair of data lines and another circuit component for sensing the other of the pair of data lines such that the circuit components are activated in response to separate activation signals;
    wherein the separate activation signals are inputted to each set of power terminals of the circuit components, and the power terminals of the circuit components are separate from each other,
    wherein, the separate activation signals are independent from each other and are provided through separate and independent signal sources from each other.

13. The semiconductor integrated circuit according to claim 12, further comprising a plurality of drivers configured to independently generate the respective activation signals in response to sense amplifier driving signals.

14. The semiconductor integrated circuit according to claim 12, wherein the circuit component for sensing one of the pair of data lines is configured to receive a first power supply voltage and a first ground voltage as the respective activation signals.

15. The semiconductor integrated circuit according to claim 14, wherein the another circuit component for sensing the other between the pair of data lines is configured to receive a second power supply voltage and a second ground voltage as the respective activation signals.

16. The semiconductor integrated circuit according to claim 15, wherein the first and second power supply voltages have substantially same level.

17. The semiconductor integrated circuit according to claim 13, wherein one of the plurality of drivers is configured to output one of a first-level power supply voltage and a second-level power supply voltage as one of the activation signals in response to first and to second sense amplifier driving signals, and output a ground voltage as the other of the activation signals in response to a third sense amplifier driving signal.

18. A semiconductor integrated circuit comprising:
    a memory cell block; and
    a plurality of sense amplifiers coupled to the memory cell block through each of the pairs of bit lines which comprise a circuit component for sensing one of the pair of data lines and another circuit component for sensing the other of the pair of data lines such that the circuit components are activated in response to separate activation signals;

wherein the plurality of sense amplifiers are configured to be inputted with the separate activation signals through each set of power terminals of the plurality of sense amplifiers, and the power terminals of the plurality of sense amplifiers are separated from each other wherein, the separate activation signals are independent from each other and are provided through separate and independent signal sources from each other.

19. The semiconductor integrated circuit according to claim 18, further comprising a plurality of drivers configured to independently generate the respective activation signals in response to sense amplifier driving signals.

20. The semiconductor integrated circuit according to claim 19, wherein the plurality of drivers are configured to output one of a first-level power supply voltage and a second-level power supply voltage as one of the activation signals, in response to first and second sense amplifier driving signals, and output a ground voltage as the other of the activation signals in response to a third sense amplifier driving signal.

* * * * *